United States Patent [19]
Rumennik

[11] Patent Number: 5,430,315
[45] Date of Patent: Jul. 4, 1995

[54] BI-DIRECTIONAL POWER TRENCH MOS FIELD EFFECT TRANSISTOR HAVING LOW ON-STATE RESISTANCE AND LOW LEAKAGE CURRENT

[76] Inventor: Vladimir Rumennik, 264 Delphia Cir., Los Altos, Calif. 94022

[21] Appl. No.: 321,579

[22] Filed: Oct. 11, 1994

Related U.S. Application Data

[63] Continuation of Ser. No. 96,049, Jul. 22, 1993, abandoned.

[51] Int. Cl.$^6$ ............... H01L 29/10; H01L 29/78
[52] U.S. Cl. .................... 257/331; 257/332; 257/333; 257/334; 257/403
[58] Field of Search ............... 257/330, 331, 332, 333, 257/334, 341, 342, 401, 402, 403

[56] References Cited

U.S. PATENT DOCUMENTS

| | | | |
|---|---|---|---|
| 4,929,987 | 5/1990 | Einthoven | 257/330 |
| 5,008,725 | 4/1991 | Lidow et al. | 357/23 |
| 5,136,350 | 8/1992 | Itoh | 257/401 |
| 5,293,053 | 3/1994 | Malhi et al. | 257/330 |

FOREIGN PATENT DOCUMENTS

| | | | |
|---|---|---|---|
| 58-184767 | 10/1983 | Japan | 257/332 |
| 4-206972 | 7/1992 | Japan | 257/330 |
| 2089118 | 6/1982 | United Kingdom | 257/331 |

OTHER PUBLICATIONS

Daisuke Ueda, et al, *An Ultra-Low On-Resistance Power MOSFET* . . . , IEEE Transactions on Electron Devices, vol. ED-34, No. 4, Apr. 1987.

B. Jayant Baliga, et al, *The Accumulation-Mode Field-Effect Transsstor* . . . , IEEE Electron Device Letters, vol. 13, No. 8, Aug. 1992.

*Primary Examiner*—Ngân V. Ngô
*Attorney, Agent, or Firm*—John A. Frazzini

[57] ABSTRACT

A trench MOSFET that includes a charge carrier getter region to substantially deplete a plurality of body regions during an off-state of this MOSFET to produce a very low off-state leakage current. In a first class of embodiments, this charge carrier getter region is a thin layer of material, of opposite conductivity type to that of the body regions, and located between a plurality of gate regions and the body regions. In a second class of embodiments, the gate regions are of opposite conductivity type to the body regions to function as a charge carrier getter region as well as a gate region.

10 Claims, 7 Drawing Sheets

BI-DIRECTIONAL POWER TRENCH MOS FIELD EFFECT TRANSISTOR HAVING LOW ON-STATE RESISTANCE AND LOW LEAKAGE CURRENT

This application is a continuation, of application Ser. No. 08/096,049, filed Jul. 22, 1993, now abandoned.

FIELD OF THE INVENTION

This invention relates in general to power transistors and relates more particularly to trench-based, power MOS field effect transistors (TMOSFETs).

Convention Regarding Reference Numerals

In the figures, each element indicated by a reference numeral will be indicated by the same reference numeral in every figure in which that element appears. The first digit of any reference numeral indicates the first figure in which its associated element is presented.

BACKGROUND OF THE INVENTION

Power MOSFETs with very low on-state resistance are useful in a number of applications, such as disk drives, automotive electronics and power supplies. In the case of power supplies for VLSI chips, output power rectifiers must support 20 volts to provide a 3.3 volt output. In order to minimize the power loss in such power MOSFETs, these MOSFETs must have as low an on-state resistance as possible and as high an off-state resistance as possible. The on-state and off-state resistances of these devices are determined by the doping concentration, thickness and width of drift regions within which current is conducted. Because the channel resistance is a major part of the total on-state resistance, this resistance must be as small as possible in its on-state and as large as possible in its off-state. Although a power MOSFET with reduced resistance can be produced by increasing its channel width (see for example, U.S. Pat. No. 5,008,725 entitled *Plural Polygon Source Pattern For MOSFET* issued to Alexander Lidow, et al on Apr. 16, 1991), this is not an attractive approach, because device compactness is also important. Indeed, a standard figure of merit for these devices is the product of the on-state resistance and the die area, because this figure of merit reflects both the compactness and the on-state power loss of this device. Thus, it is a common design goal to produce power MOSFETs having the smallest possible product of on-state resistance and die area.

Power MOSFETs having a reduced product of on-state resistance and device area have been manufactured as trench-based MOSFETs (also referred to as TMOSFETs). In these devices, a plurality of trenches are formed into the top surface of each die to produce a plurality of pedestals on the sidewalls of which are formed the TMOSFETs. The source and drain electrodes are formed on the top and bottom of the die, respectively, so that the electrical current flows from the top surface of the die to its bottom surface.

The article Daisuke Ueda, et al, *An Ultra-low On-resistance Power MOSFET Fabricated by Using a Fully Self-Aligned Process*, IEEE Transactions on Electron Devices, Vol. ED-34, No. 4, April 1987, presents a TMOSFET design and associated manufacturing process. Because technological factors limit the compactness of MOSFETs formed using diffusion fabrication techniques, this paper presents a process and resulting device structure in which the dimensions are defined by the trench, thereby avoiding packing density reductions caused by mask alignment tolerances of multiple mask steps. The resulting TMOSFET is an enhancement type TMOSFET having a conduction MOS channel formed in a p-type body.

In order to avoid parasitic effects at the p-n junction between the source (the top layer of the TMOSFET) and body region (the first layer under the top layer), these two regions are shorted together. This increases the minimum lateral dimension of each pedestal by at least the minimum lateral dimensions of the body portion that penetrates through the source to produce this short, thereby producing a concomitant increase in the area of this device. Because this increased area increases the above-indicated figure of merit of this devices (i.e., the product of the on-state resistance and the die area, which is preferably minimized), this structure has a less favorable figure of merit than desired. The use of a p+ body to achieve this shorting introduces, at the source-body junction, an n+- p+ junction that can cause latchup. The use of a p+ body to achieve this shorting also introduces, at the body-substrate junction, a p +- n junction that conducts carriers like a diode, thereby degrading the bidirectionality of its switching.

The TMOSFET presented in the article B. J. Baliga, T. Syau, and P. Venkatraman, *The Accumulation-Mode Field-Effect Transistor: A New Ultralow On-Resistance MOSFET*, IEEE Electron Device Letters, Vol. 13, No. 8, August 1992, pp. 427-429 contains n+ source and drain regions in contact with an n— body region (its "body region"). Therefore, because the source and drain regions are doped with the same polarity of charge carriers, the parasitic capacitance at the boundaries between the body region and the drain and source regions will be much smaller than for the TMOSFET presented in the Ueda article discussed above. However, this device exhibits an undesired level of off-state leakage current through these three regions because of the relatively high conductivity of the body regions during an off-state.

SUMMARY OF THE INVENTION

In accordance with the illustrated preferred embodiments, TMOSFET structures are presented that each provides a high level of on-state current and a low level of off-state current and are each simple to manufacture by a process requiring a small number of mask steps. In addition, these new device structures each exhibits a greatly reduced parasitic capacitance compared to prior TMOSFET structures.

These TMOSFET structures include a set of vertically-oriented TMOSFET body regions that extend from a top surface of the device to a bottom surface of this device. By "vertically oriented" is meant that this body region conducts charge in a direction perpendicular to a top surface of a die in which this TMOSFET is manufactured. These new structures include "charge carrier getter regions" that are each doped of conductivity type opposite to that of the body regions of this TMOSFET, thereby producing p-n junctions that deplete the body region in each pedestal without requiring the application of any external voltages to achieve this depletion. The spatial dimensions and the charge concentrations of the getter regions and the body regions are selected to ensure that, in the off-state, the body regions are completely depleted. This reduces the off-state conductivity of this TMOSFET many orders of magnitude compared to the prior art devices. These regions are referred to as "charge carrier getter regions", because they function to drain the body regions of charge carriers during an off-state of this TMOSFET. This depletion produces a very large off-state resistance, thereby greatly reducing the off-state leakage current. The dimensions and charge carrier concentrations in the body regions and the charge carrier getter regions are selected such that, in the off-state of this TMOSFET, not only are the body regions depleted, in addition the charge carrier getter regions are depleted, thereby further reducing the off-state leakage current.

In a first preferred embodiment, this charge carrier getter region is located between the body region and an insulating layer at a side surface of each gate region. In a second preferred embodiment, the gate regions are each doped of opposite type to the body region, so that the difference in work functions of these two regions depletes the body regions in the off-state. Even though, in this second embodiment, between the gate and body regions is a gate oxide layer that prevents direct current flow between these to regions, the difference in the work functions of the gate and body regions produces between these regions an electric field that tends to deplete both of these two regions. In both embodiments, the dimensions and dopant concentrations of the charge carrier getter regions and the body regions are selected such that, without applying any external bias to deplete either of these two regions, the body regions are substantially depleted in the off-state. In the first embodiment, these dimensions and dopant concentrations are selected such that both the charge carrier getter regions and the body regions are substantially depleted in the off-state.

Because the getter and body regions are depleted in the off-state, there is no need to short the body to the source and drain regions, as was required in the prior art embodiment discussed above. This reduces the device area, which reduces the $R_{on}$·Area figure of merit for this TMOSFET. However, in the on-state of this TMOSFET, the dopant level of the body region produces the desired low on-state resistance.

Another advantage of this structure is the ability to operate this device at higher temperatures than those at which prior art devices can operate. There are several reasons why these prior art devices have an operating temperature range that is limited to less than about 150–175 degrees Centigrade. In these prior art devices, at temperatures above this range: the threshold voltage of these prior devices decreases linearly with temperature, thereby increasing leakage through the MOS channel; the bulk leakage current becomes too large; and the threshold voltage is much more sensitive to temperature variations because, unlike the TMOSFET presented herein, the body is not depleted at zero gate voltage.

A further advantage of this structure is that it exhibits an increased carrier mobility in the on-state of this device. The reason for this is as follows. It has been shown experimentally that the electron mobility in the pedestal is a decreasing function of the electric field component perpendicular to the gate oxide. However, because this structure produces a depleted body region in its off-state, the component of the electric field at the body-gate interface is, in general, lower than for conventional devices, thereby reducing on-state resistance by increasing on-state mobility.

These TMOSFETs preferably include two sets of parallel trenches, thereby forming a rectangular array of pedestals having substantially rectangular lateral cross-sections. This structure provides a large area on the sides of these pedestals, thereby reducing the on-state resistance. However, the particular shape of this cross-section is given only as a particular example.

Methods of manufacturing these TMOSFET structures are also presented. An etch/dopant barrier is formed on top of a substrate and is patterned to produce openings through which the substrate is then etched to form the trenches. An isotropic doping process is utilized to dope the sidewalls of each trench, thereby producing the charge carrier getter regions. An anisotropic etch removes this doped region at the bottom of each trench and extends the depth of each trench below the charge carrier getter regions that were formed on the sidewalls of each trench. The trenches are oxidized and then filled with a conductive material, such as polysilicon, to produce the gate regions.

In the second preferred embodiment discussed above, the step of doping the sidewalls of the trenches is omitted. Instead, the trenches are filled with a conductive material that is doped of opposite conductivity type to that of the pedestals. The level of doping within the trench-filling material is selected to substantially deplete the charge carrier density in the pedestals during an off state of this TMOSFET and to produce a low resistivity in the pedestals during an on state of this TMOSFET. These choices result in a TMOSFET that provides the low on-state resistivity exhibited by the devices discussed above in the Background of the Invention, but which also provides a much lower off-state leakage current than is exhibited by both of the above-discussed prior art TMOSFETs. Because both of these preferred embodiments do not include any p-n junctions, that are capable of injecting carriers, neither exhibits the parasitic p-n junction-related problems of the TMOSFET presented in the Ueda reference discussed above.

A gate contact is formed on a top surface of the trench-filling conductive material in at least one portion of the interconnected trenches. This gate contact extends outward, away from the trench area to form a wire bonding pad. Because the conductive material in the trenches forms a linked gate region, voltages applied to this gate contact region will produce substantially the same potential throughout all of the gate region. An insulating barrier is formed on top of all portions of the gate region that are not already covered by the gate contact or by the etch/dopant barrier.

A metal layer is formed on top of the substrate and is patterned to electrically contact the tops of the n+ body regions in the pedestals, thereby functioning as the source contact. A substrate contact is also formed on a back side of the wafer and functions as the drain contact.

DESCRIPTION OF THE PREFERRED EMBODIMENTS

Device Structures

Figure 1:
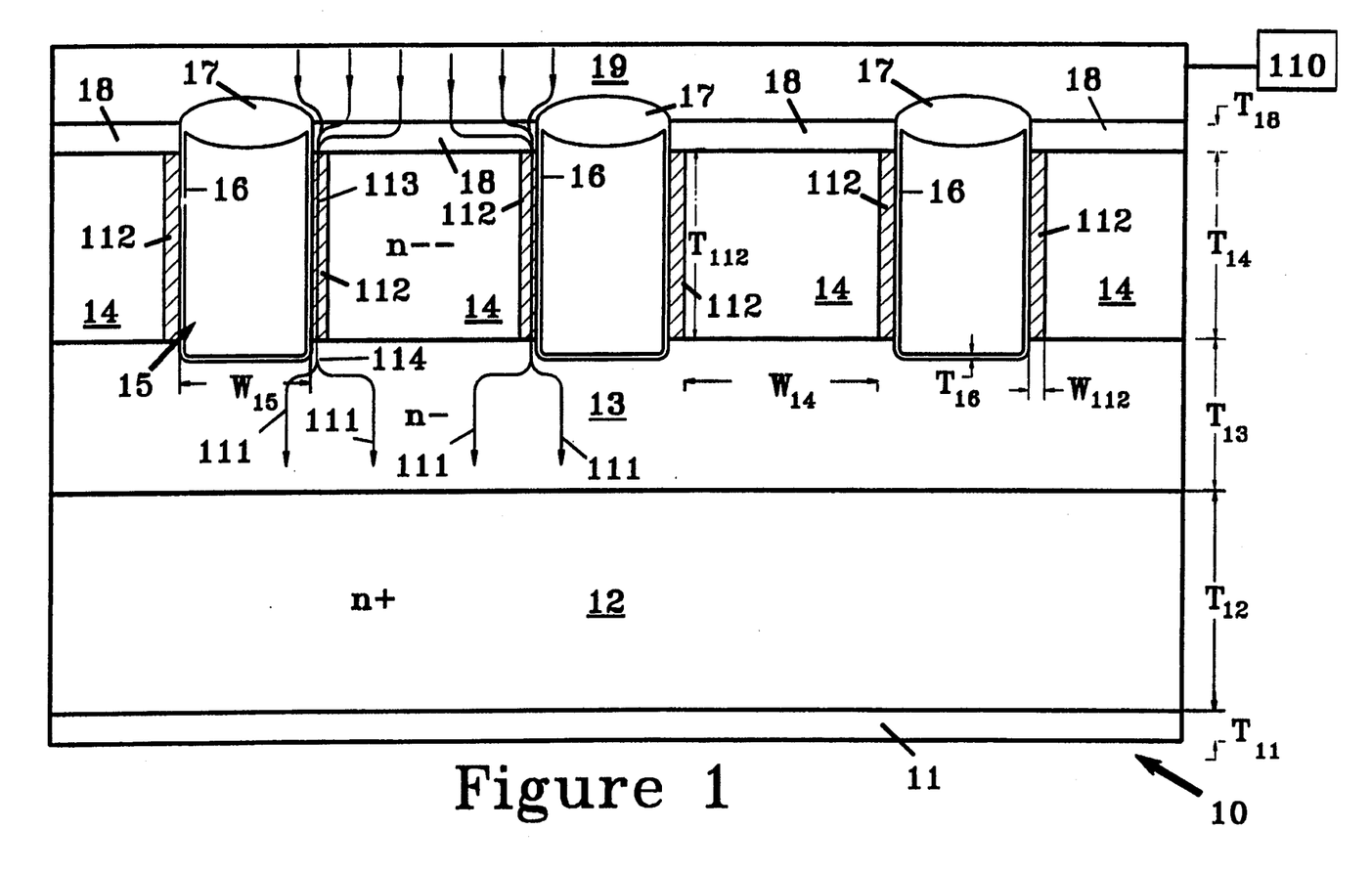
FIG. 1 is a side cross-sectional view of a TMOSFET that includes charge carrier getter regions to substantially reduce conductivity in the TMOSFET pedestals during an off state of the TMOSFET.

FIG. 1 is a side cross-sectional view of a TMOSFET 10 that includes a set of charge carrier getter regions to substantially reduce conductivity of the TMOSFET during an off-state of the TMOSFET. A drain electrode 11, of a conductive material, is in direct contact with an n+ substrate 12 of dopant concentration on the order of $10^{19}$ atoms per cubic centimeter. The dopant levels indicated herein are for the case of TMOSFETs manufactured in a silicon die. However, analogous devices can be manufactured in other types of dies and can also be manufactured with the polarities of the charge carriers in various regions reversed as compared to this embodiment. The thickness $T_{12}$ of substrate 12 is on the order of 500 microns. At the end of the fabrication process, this layer will be mechanically lapped to thin this layer to about 200 microns. The dopant concentration of substrate 12 is selected to produce a high level of conductivity.

On top of this n+ substrate is an n− epitaxial layer 13 of thickness $T_{13}$ on the order of 4 microns and of dopant concentration on the order of $10^{16}$ atoms per cubic centimeter. This produces a TMOSFET having a breakdown voltage of approximately 100 volts. For embodiments in which this thickness is 2 microns or zero microns, the breakdown voltage will be 50 volts and 30 volts, respectively. On top of this first epitaxial layer 13 is an n−− epitaxial layer, of dopant concentration on the order of $10^{14}$ atoms per cubic centimeter, that functions as a body region 14. The thickness $T_{14}$ of this layer is on the order of 2 microns. This low dopant level is selected so that the n−− body region can be substantially fully depleted during an off-state of this TMOSFET.

A plurality of gate regions 15, each of width $W_{15}$ on the order of 1 micron and depth D on the order of 2.5 microns, extend through the n−− layer. In the on-state, conductive channels are formed at the sidewalls of the gate regions, thereby enabling current to flow from the source electrode 19 to the drain electrode 11. These gate regions are formed of a conductive material, such as polysilicon doped with a p-type dopant to a concentration on the order of $10^{19}$ atoms per cubic centimeter. An insulating layer 16 of thickness $T_{16}$ on the order of 500 Angstroms and an insulating region 17 of thickness on the order of 1 micron, of an insulating material such as silicon dioxide, isolates each gate region 15 from metal electrode 19. An n+ source region 18, of dopant concentration on the order of $10^{20}$ atoms per cubic centimeter and of thickness on the order of 0.5 microns, is located on top of body regions 14 to electrically connect them in parallel to a source electrode 19 in order to inject current into these body regions. A voltage source 110 is connected between source electrode 19 and drain electrode 11 to control the voltage drop across these body regions.

When a voltage bias on the order of 5 volts is applied to gate region 15, a conduction channel is formed at the interface between insulating layer 16 and n− body region 14. As illustrated by the current flow lines 111 in FIG. 1, it is important that the gate regions penetrate completely through body region 14 so that the point 113, where the current begins to spread out after passing through this conduction channel, is located within n− epitaxial layer 13 instead of within the much less conductive n−− body region 14, so that there is sufficient conductivity for these flow lines to spread out across substantially the entire lateral cross-section of layer 13. Similarly, the conductivity of source region 18 is high enough that current can be collected across the entire interface between regions 18 and 19. These choices greatly reduce the total resistance of the conductive path of this current.

Located between each body region 14 and adjacent insulating layer 16 is a charge carrier getter region 112 of conductivity type opposite to that of the body regions. Because the charge carrier getter regions 112 and the body regions 14 are of opposite conductivity types, p-n junctions are formed between these regions. The dopant concentrations of getter regions 112 and body regions 14 and their respective widths $W_{15}$ and $W_{14}$ are selected such that the body regions 14 are all substantially depleted of charge carriers when the voltage on source electrode 19 produces an off-state of this TMOSFET. In the preferred embodiments, the bias to the gate regions is zero in the off-state.

Each charge carrier getter region depletes a portion of the body region in contact with this getter region. This depleted region extends from the interface between this getter region and this body region to a depth DL into the body region. Depth DL is referred to as the "depletion length" and is equal to $C_{112} \cdot W_{112} / C_{14}$, where $C_{112}$ is the dopant concentration in getter regions 112, $W_{112}$ is the width of each getter region 112 and $C_{14}$ is the dopant concentration of body regions 14. Therefore, the dopant concentrations of the body and getter regions are selected such that DL is at least half the width $W_{14}$ of each body region 14. Subject to this constraint, the dopant levels are selected to be as large as possible. This produces a high impedance for zero gate-to-source voltage difference (i.e., an off-state) and produces a high conductivity for an on-state. Because there are charge carrier getter regions in contact with both sides of each body regions 14, charge depletion is produced from both sides. The dimensions and dopant concentrations of body regions 14 and of charge carrier getter regions 112 are selected such that the body regions 14 are depleted in the off-state. Preferably, these parameters are chosen such that $W_{14}$ is equal to or slightly smaller than 2·DL so that the body regions are depleted without requiring any external bias to achieve this depletion, but are just barely completely depleted so that the external bias needed to restore full conductivity of the body regions is minimized. This choice provides the maximal off-state impedance while minimizing the bias needed to turn this TMOSFET on completely. The factor of 2 in this factor "2DL" arises because the body regions are depleted from both sides, thereby requiring that each getter region deplete only the nearest half of its adjacent body region.

In this embodiment, the width $W_{112}$ of each charge carrier getter region 112 is on the order of 0.25 microns and the dopant concentration $C_{112}$ of each charge carrier getter region 112 is on the order of $1 \cdot 10^{11}$ atoms per square centimeter, so that each charge carrier getter region 112 produces in its associated body region 14 a depletion region slightly greater than half the width $W_{14}$ of each body region 14.

Method of Manufacture

Figure 2A:
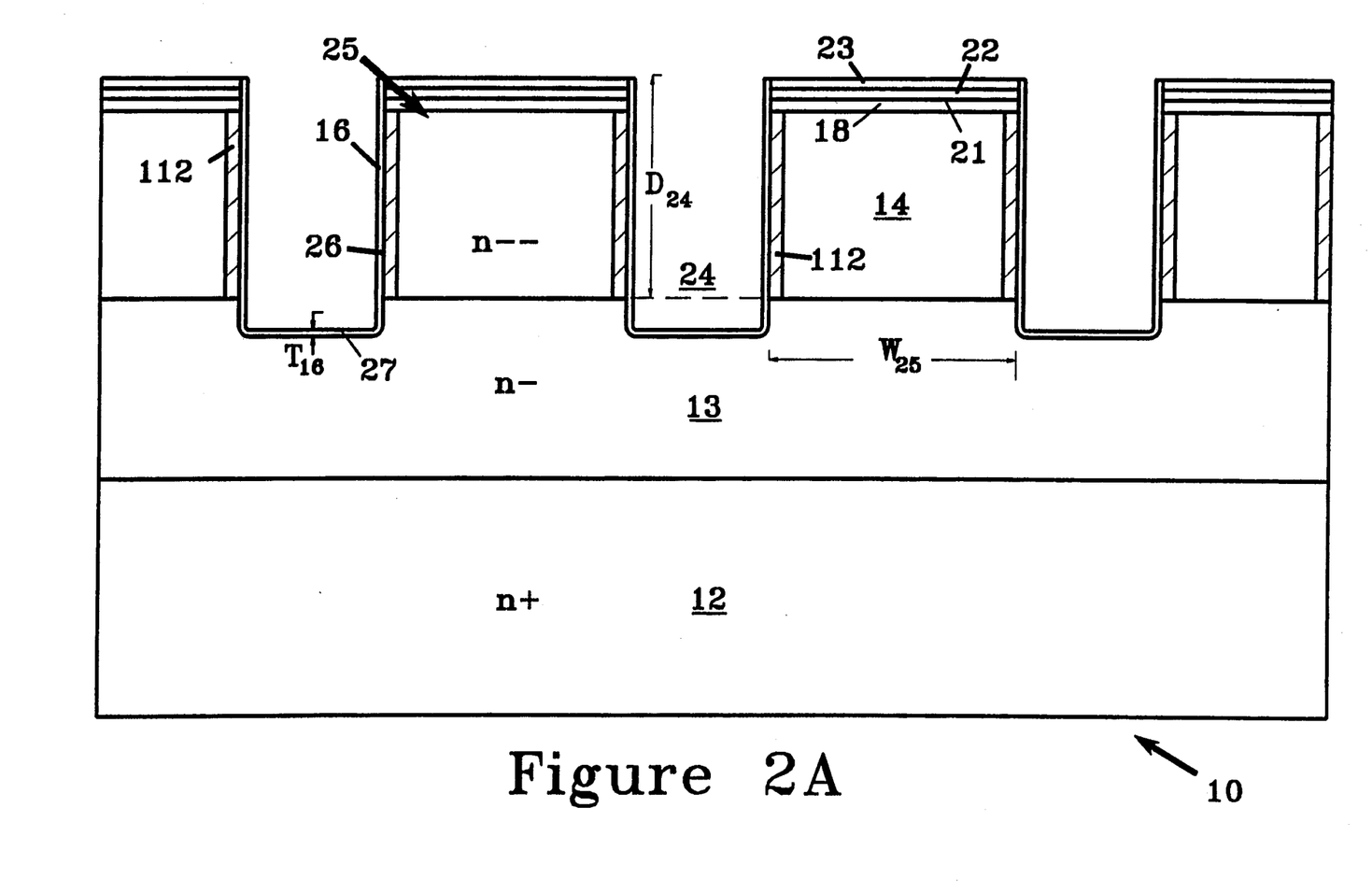
FIGS. 2A–2D illustrate a process of manufacturing the TMOSFETs of FIGS. 1 and 3.

Because the following process steps can be implemented by many well-known processes, the details, such as temperatures, pressures and reactants, will not be described herein. As illustrated in FIG. 2A, an n− epitaxial layer 13 and an n— — epitaxial layer 14, doped to $10^{16}$ and $10^{14}$ cm$^{-3}$, respectively, are grown sequentially on the top of an n + wafer substrate 12 doped to $10^{19}$ cm$^{-3}$. A top surface 21 of layer 14 is doped with an n-type dopant to form an n+ source region 18 and is then oxidized to form an oxide layer 22 on top of which a silicon nitride layer 23 is deposited.

Two sets of parallel trenches 24, oriented perpendicular to each other, are etched to an initial depth $D_{24}$ of about 2 microns and width $W_{24}$ on the order of 1 micron, thereby forming a plurality of pedestals 25 of width $W_{25}$ on the order of 2 microns. This depth is selected to be equal to the thickness of epitaxial layer 14 so that the bottoms of these trenches are located substantially at the interface between epitaxial layers 13 and 14. As illustrated by the embodiment in FIG. 3, these trenches 24 are perpendicular to one another, so that the pedestals have a rectangular lateral cross-section. This pattern of intersecting trenches is exemplary and is presented here as one simple choice for producing an array of pedestals.

The substrate is exposed at high temperature to a p-type dopant, such as boron to form, at the sidewalls 26 of the trench, p-type layers that function as charge carrier getter regions 112. The above-indicated silicon nitride layer 23 prevents doping of the tops of the pedestals. Additional reactive ion etch is utilized to deepen the trenches about 0.25 microns, so that the p-type layer 112 is removed from the bottoms 27 of the trenches and so that the trenches are extended below the interface between epitaxial layers 13 and 14. As will be seen later, the extension of the trenches below this interface is important in ensuring that, in the on-state, the current exits from a conductive channel (formed at the interfaces between getter regions 112 and insulating layer 16) into n— epitaxial layer 13 instead of into n— — layer 14 which would inject a much higher resistance to current flow.

Figure 2B:
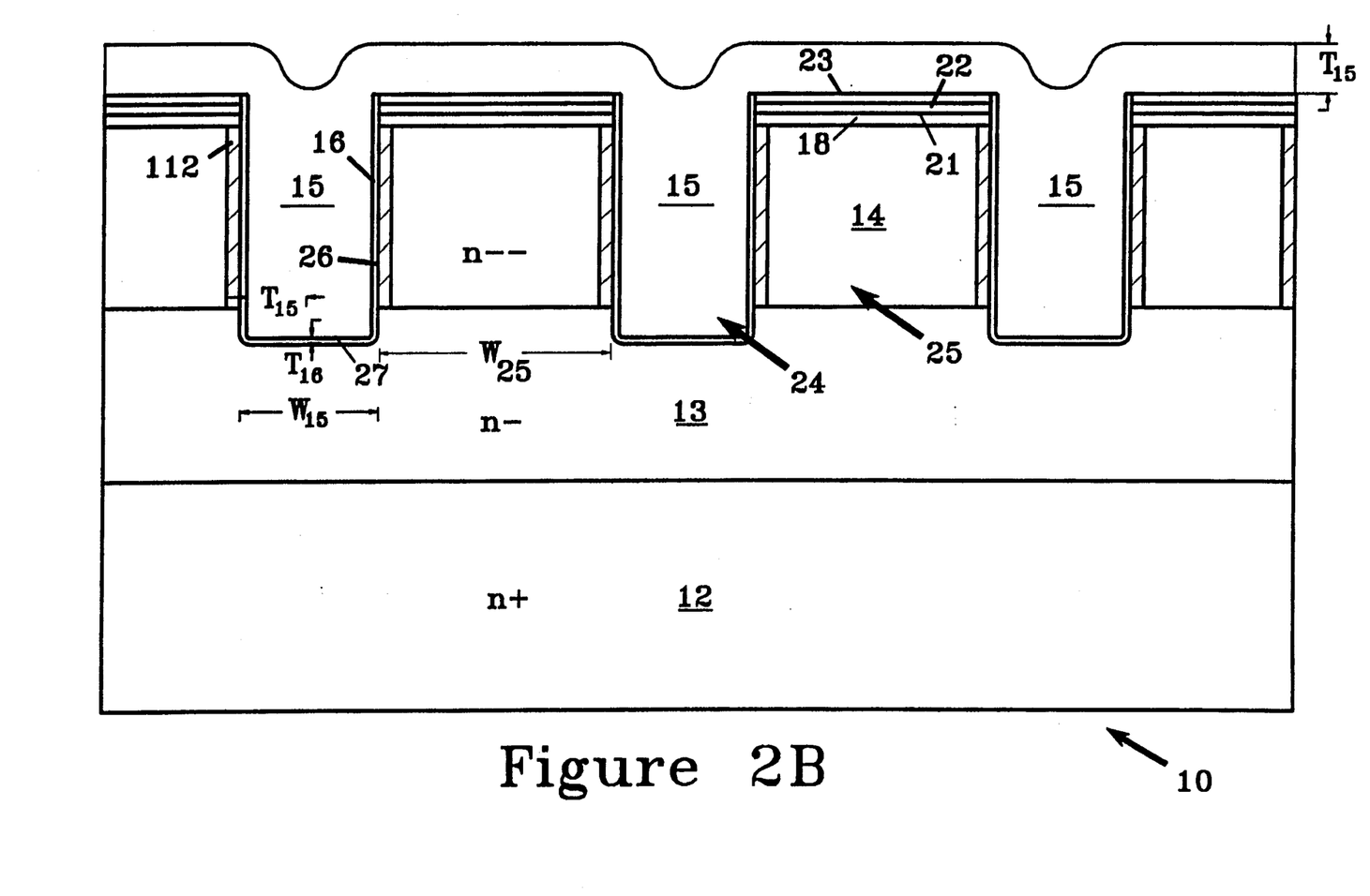

A thermal oxide growth process produces a gate oxide layer 28 of thickness $T_{28}$ on the order of 500 Å. As illustrated in FIG. 2B, a polysilicon layer 29, of thickness $T_{29}$ slightly larger than half the width $W_{15}$ of each trench 15, is next deposited on the die to fill the trenches. Polysilicon layer 29 is doped (e.g., in situ or by a diffusion step after deposition of layer 29) with a dopant, such as phosphorus or boron, to produce a dopant concentration on the order of $10^{20}$/cm$^3$. This heavy dopant level produces a highly conductive polysilicon gate region.

Figure 2C:
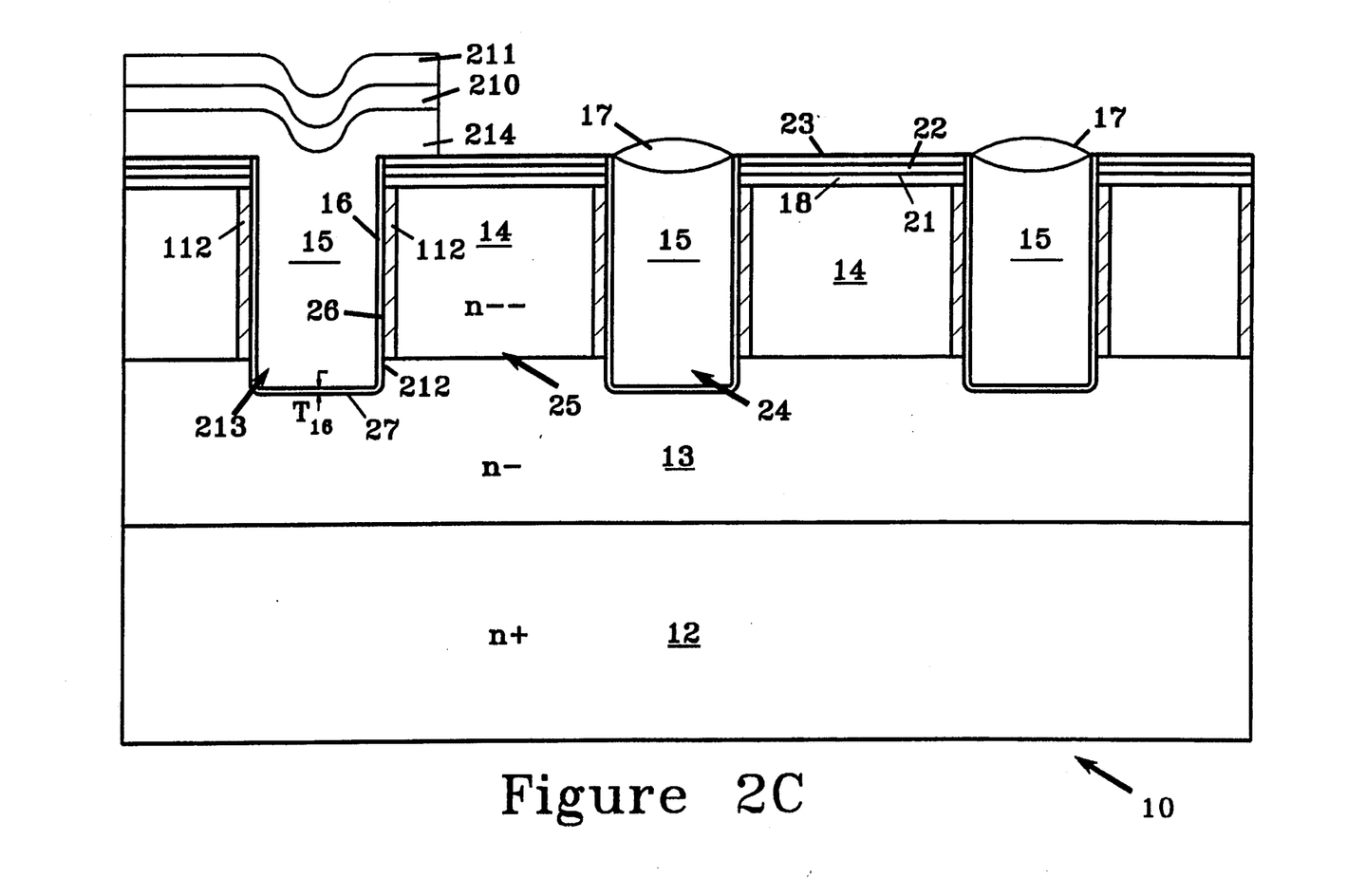

As illustrated in FIG. 2C, a thin layer (on the order of 1,000 Å thick) of silicon nitride 210 is deposited on top of the die to produce an insulating layer and is then covered by a layer of photoresist 211. This layer of photoresist is patterned to expose the silicon nitride layer 210 and the polysilicon layer 29 in all regions other than a region that extends from an inner edge 212 of a perimeter trench 213 outward toward an edge of the die to leave a region of polysilicon that will function as a contact pad 214 (also shown in FIG. 3) for applying an electrical gate voltage to the polysilicon gate regions 29.

As illustrated in FIG. 2C, the portions of Si$_3$N$_4$ layer 210 and polysilicon layer 29 that are not protected by the photoresist are etched, for example by exposing the top of the die to a plasma etch, to remove the polysilicon layer in the regions above the pedestals 25 and to etch the polysilicon layer 29 in the regions above the trenches 24 until the top of the polysilicon layer is slightly below the tops of the pedestals.

Figure 2D:
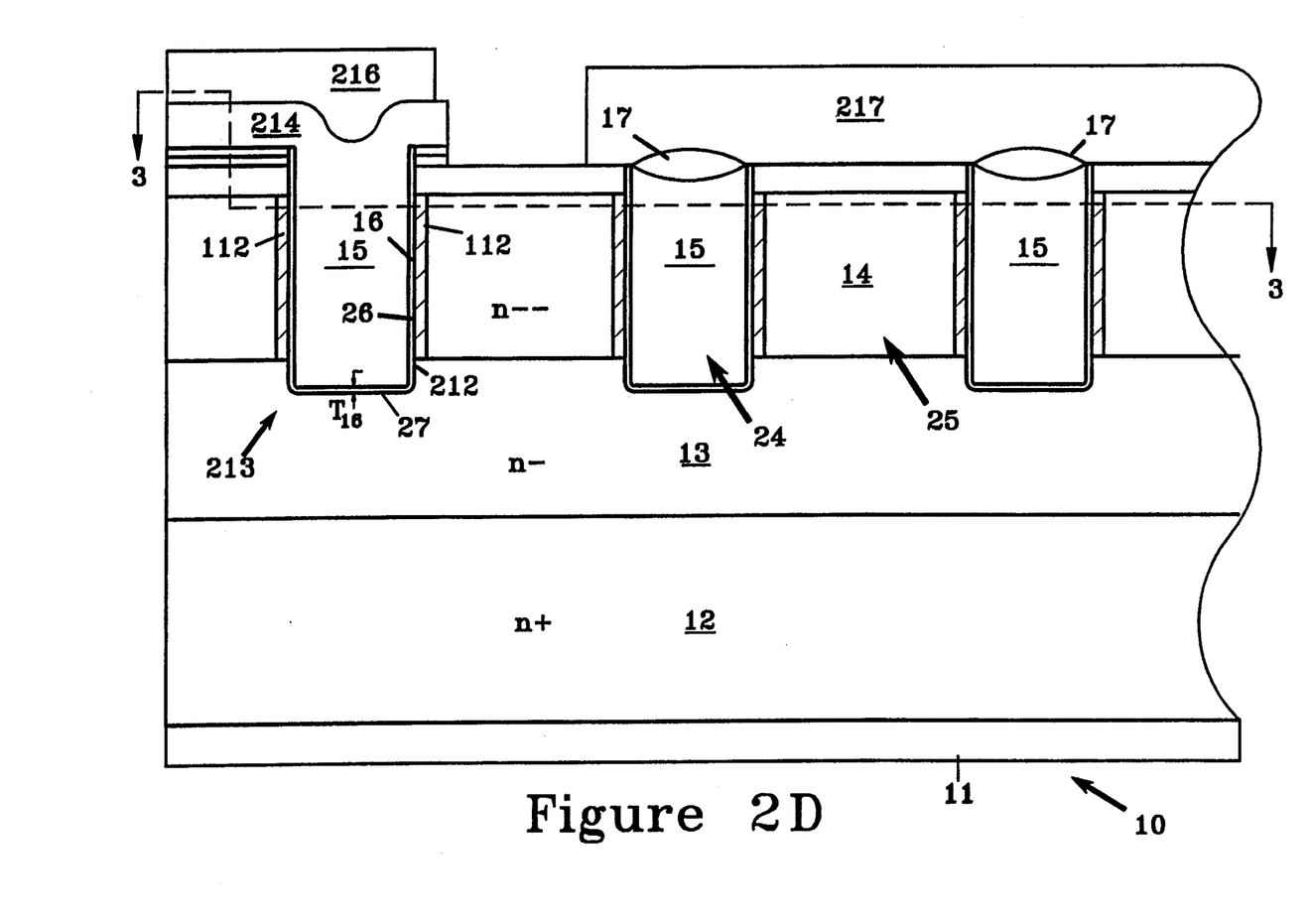

As illustrated in FIGS. 2C and 2D, the wafer is then exposed to oxygen at a temperature on the order of 1000° C. to produce a thermal oxide barrier 17 on top of the polysilicon within all portions of the trenches that are not shielded by polysilicon layer 211 and silicon nitride layer 212.

Photoresist 211 is stripped and silicon nitride layer 210 is removed by a wet etch process using, for example, phosphoric acid, to expose the top surface of polysilicon layer 29, to enable electrical contact to be made with that layer. A layer of conductive material, such as aluminum, is deposited on the wafer and is covered with a photoresist layer that is patterned to enable this layer to be divided into a gate electrode 216 and a source electrode 217. The gate electrode 216 controls the voltage on the interconnected array of polysilicon gate regions 29. The voltage on electrode 217 controls the forward bias applied to the body regions 14.

Figure 3:
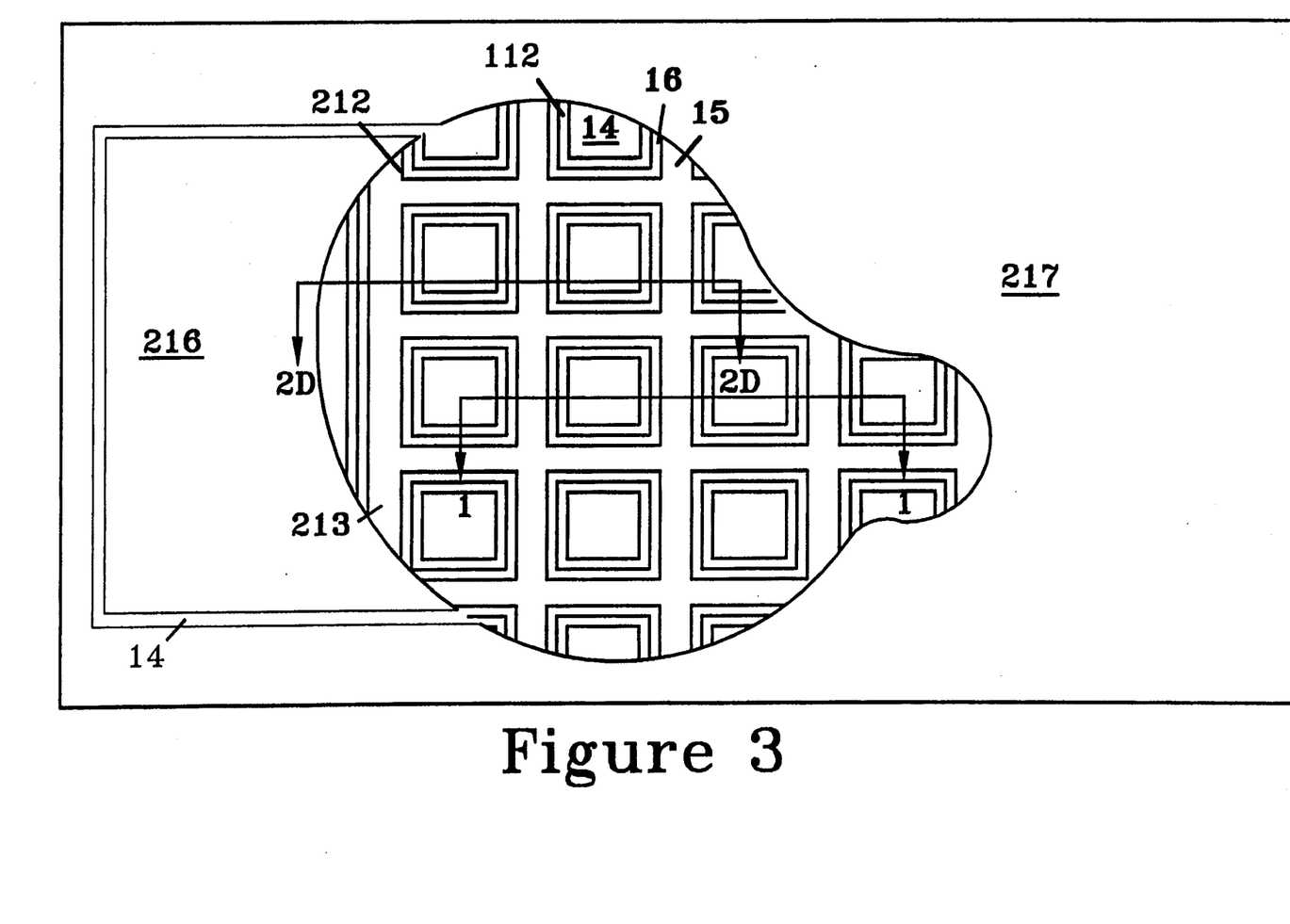
FIG. 3 is a top cross-sectional view of the TMOSFET of FIG. 1.

FIG. 3 is a top cross-sectional view of the TMOSFET of FIG. 2D along the cut indicated by line 3—3 in FIG. 2D. This figure illustrates the lateral cross-sectional size and shape of metal layer 216 and gate contact 217. The view along this cut reveals the body regions 14, the gate regions 15 and the insulating layers 16 of FIG. 2D. In this FIG. 3, gate electrode 216 is shown as extending across just over three rows of pedestals. This was done only for convenience in preparing this drawings, to illustrate the general relationship between metal layer 216 and the array of pedestals. In the actual preferred embodiment, each pedestal has a lateral size of about 2 microns, whereas gate electrode 216 is rectangular, with length and width on the order of 100 microns. Thus, in the actual embodiment, this pad has length and width about 50 times the length and width of each pedestal.

Alternate Embodiment

Figure 4:
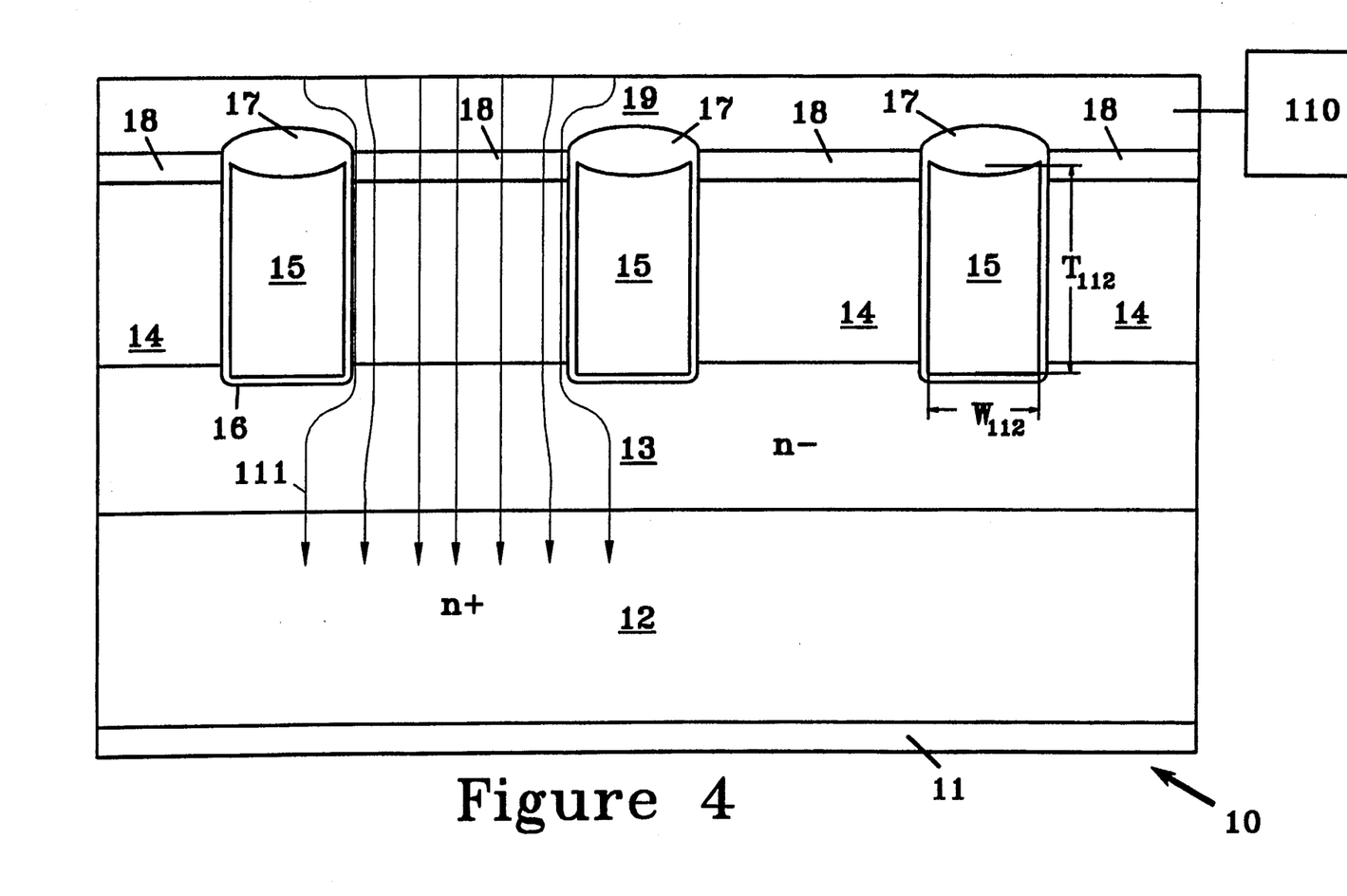
FIG. 4 is a side cross-sectional view of an alternate embodiment of the TMOSFET illustrated in FIGS. 1 and 3.

FIG. 4 is a side cross-sectional view of an alternate embodiment of the TMOSFET illustrated in FIGS. 1 and 3. This embodiment differs from that in FIG. 1 in the following ways: the p-doped charge carrier getter regions 112 are eliminated; the gate regions 15 are now p-doped to function additionally as charge carrier getter regions; and the quantity of free charge carriers in each gate region 15 is at least equal to (and is preferably much higher than) the quantity of free charge carriers in each body region 14. Because of the difference in work function of the gate and body regions, the body regions are depleted when an equilibrium condition is reached between these two regions.

The work functions of these two regions are selected such that the body regions are depleted in the off-state of this TMOSFET. Because the oxide barrier 16, 17 prevents current flow from source electrode 19, through gate regions 15 to drain electrode 11, it is not necessary that gate regions 15 are themselves depleted during an off-state. However, in general, the total quantity of charge in the gate regions is selected to be much larger than the total quantity of charge in the body regions. Therefore, the regions 15 not only function as gates, they also function as charge carrier getters.

This embodiment provides the same advantages over the prior art that are provided by the embodiment illustrated in FIG. 1. The resulting effect of this device construction is that, in addition to current flow 111 through the conduction channel formed at the interface between insulating layer 16 and n— — body region 14, there is also current flow throughout the pedestal, when the gate is biased positively in respect to the source. Under this voltage bias, the depletion region collapses in the middle of the pedestal, thus opening a conductive path between the source and the drain. Therefore, in contrast to the case presented in FIG. 1 in which the current flow between source region 18 and epitaxial layer 13 is restricted to a narrow conduction channel at the interface between the charge carrier getter regions 112 and insulating layer 16, in this case the current flows throughout body regions 14.

I claim:

1. A trench MOSFET comprising:
   (a) at least one pedestal, that functions as a vertically-oriented body region, doped with a first conductivity type of dopant, extending in a direction from a top surface to a bottom surface of this MOSFET;
   (b) for each of said pedestals:
   (b.1) at least one gate region adjacent to a sidewall of said pedestal and extending across substantially the entire sidewall to control conduction of current throughout said pedestal, whereby a voltage applied to said gate region controls a conductivity of said pedestal;
   (b.2) an insulating layer, on a sidewall of said pedestal, between said gate region and said pedestal; and
   (b.3) at least one charge carrier getter region, of a second conductivity type opposite to the first conductivity type, in electrical contact with said pedestal, whereby, between each pedestal and each charge carrier getter region with which it is in electrical contact, is formed a p-n junction that tends to deplete a charge carrier density within said pedestal;
   wherein a dopant concentration in each charge carrier getter region, a dopant concentration of each body region, a width of each charge carrier getter region, a width of each body region, a thickness of each charge carrier getter region and a thickness of each body region are selected to substantially deplete each body region when said trench MOSFET is in an off-state.

2. A trench MOSFET as in claim 1 further comprising:
   means for varying a bias applied to said gate to control whether this MOSFET is in an off-state or an on-state.

3. A trench MOSFET as in claim 1, wherein said charge carrier getter region is located between said gate region and said at least one body region.

4. A trench MOSFET as in claim 1 wherein said charge carrier getter region has a thickness $T_{112}$ substantially equal to a thickness $T_{14}$ of said body regions, whereby said charge carrier getter region extends across substantially all of a sidewall of said body region, located between said body region and said gate region.

5. A trench MOSFET as in claim 1 wherein a dopant concentration $C_{112}$ in the charge carrier getter region, a width $W_{112}$ of the charge carrier getter region, a width $W_{14}$ of the body regions, a thickness $T_{112}$ of the charge carrier getter regions and a thickness $T_{14}$ of the body regions are selected to substantially deplete both said body regions and said getter regions when said trench MOSFET is in an off-state.

6. A trench MOSFET as in claim 1 wherein said gate region and said charge carrier getter region are the same region and are of a second conductivity type opposite to the first conductivity type.

7. A trench MOSFET as in claim 1 wherein said charge carrier getter region has a thickness $T_{15}$ equal to or greater than the thickness $T_{14}$ of said body regions and extends across all of a sidewall of said body region, whereby current carried along a conductive channel, formed at each sidewall of a body region, will emerge from the conductive channel into a middle layer of higher conductivity than the body region.

8. A trench MOSFET as in claim 1 further comprising a middle substrate layer in contact with a bottom surface of each body region and having a conductivity selected to control a breakdown voltage of the trench MOSFET.

9. A trench MOSFET as in claim 1 wherein said gate region comprises a conductive material that fills an interconnected plurality of trenches that interlink to form said pedestals.

10. A trench MOSFET comprising:
    (a) at least one pedestal, that functions as a vertically-oriented body region extending in a direction from a top surface to a bottom surface of this trench MOSFET, doped with a first conductivity type of dopant;
    (b) for each of said at least one pedestal:
    (b.1) an insulating layer on a sidewall of each of said at least one pedestal; and
    (b.2) at least one gate region, of opposite conductivity type to that of each of said at least one pedestal, in contact with the insulating layer on a sidewall of each of said at least one pedestal, to control a conductivity of each of said at least one pedestal, the composition and doping of said gate region and said pedestals being selected such that this pedestal is substantially depleted of charge carriers in an off-state of this trench MOSFET;

* * * * *